(12) United States Patent
Yang et al.

(10) Patent No.: US 7,838,315 B2
(45) Date of Patent: Nov. 23, 2010

(54) METHOD OF MANUFACTURING VERTICAL LIGHT EMITTING DIODE

(75) Inventors: Jong In Yang, Suwon (KR); Sang Bum Lee, Hwaseong (KR); Si Hyuk Lee, Anyang (KR); Tae Hyung Kim, Suwon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/155,277

(22) Filed: Jun. 2, 2008

(65) Prior Publication Data
US 2009/0137075 A1 May 28, 2009

(30) Foreign Application Priority Data
Nov. 23, 2007 (KR) ............... 10-2007-0120260

(51) Int. Cl.
*H01L 21/00* (2006.01)
(52) U.S. Cl. .................... 438/46; 257/E21.09
(58) Field of Classification Search ................. 257/676, 257/76, 3, 99, E21.09, E25.032, E33.074, 257/E33.023; 438/22.46, 106, 26, 29, 458, 438/27, 47
See application file for complete search history.

(56) References Cited

U.S. PATENT DOCUMENTS 6,818,531 B1 * 11/2004 Yoo et al. ................. 438/458

2005/0173692 A1 * 8/2005 Park et al. ................. 257/13
2007/0042520 A1 * 2/2007 Oh et al. ................... 438/46

FOREIGN PATENT DOCUMENTS

| KR | 10-0706952 | 4/2007 |
| WO | WO 2006043796 | * 4/2006 |

OTHER PUBLICATIONS

Korean Office Action issued in Korean Patent Application No. KR 10-2007-0120260, dated Feb. 26, 2009.

* cited by examiner

*Primary Examiner*—Thomas L Dickey
*Assistant Examiner*—Nikolay Yushin
(74) *Attorney, Agent, or Firm*—McDermott Will & Emery LLP

(57) ABSTRACT

Provided is a method of manufacturing a vertical LED, the method including the steps of: preparing a sapphire substrate; forming a light emitting structure in which an n-type nitride semiconductor layer, an active layer, and a p-type nitride semiconductor layer are sequentially laminated on the sapphire substrate; forming a p-electrode on the p-type nitride semiconductor layer; forming a structure support layer on the p-electrode; removing the sapphire substrate through an LLO (laser lift-off) process; isolating the light emitting structure into unit LED elements through an ISO (isolation) process; and forming an n-electrode on each of the n-type nitride semiconductor layers of the isolated light emitting structures.

6 Claims, 6 Drawing Sheets

[FIG. 1A]
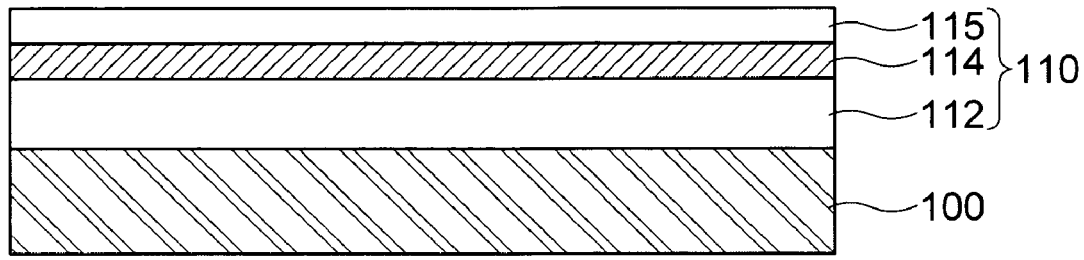
- Prior Art -
[FIG. 1B]
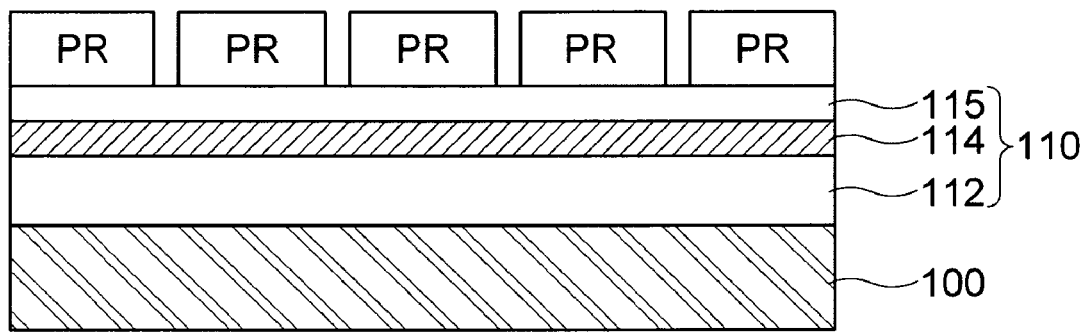
- Prior Art -
[FIG. 1C]
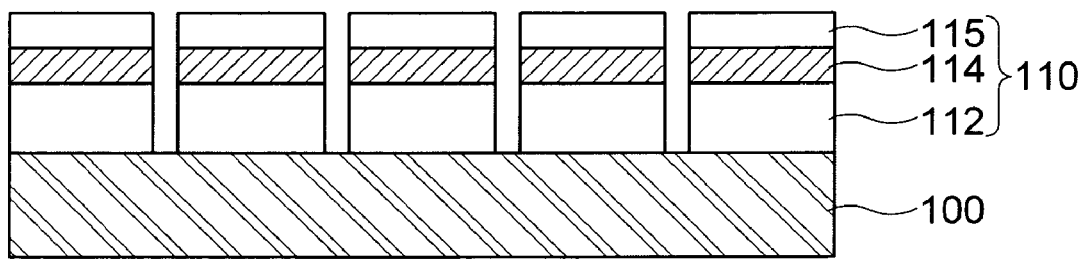
- Prior Art -

[FIG. 1D]
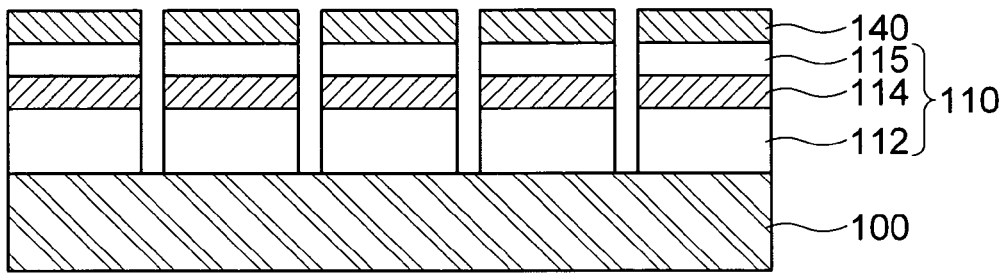
- Prior Art -
[FIG. 1E]
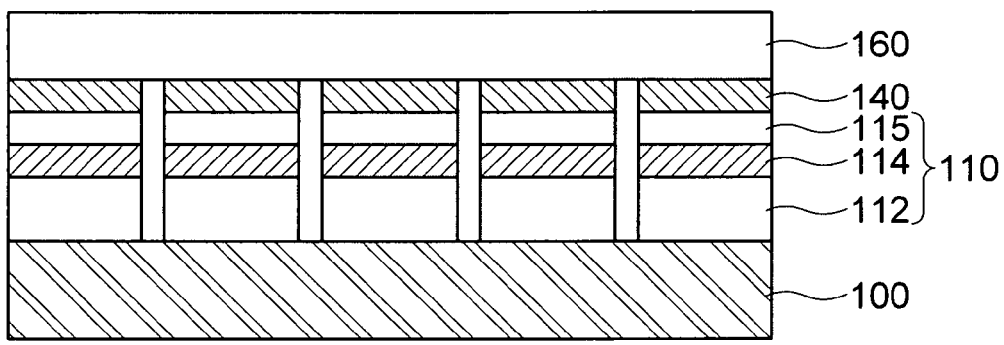
- Prior Art -
[FIG. 1F]
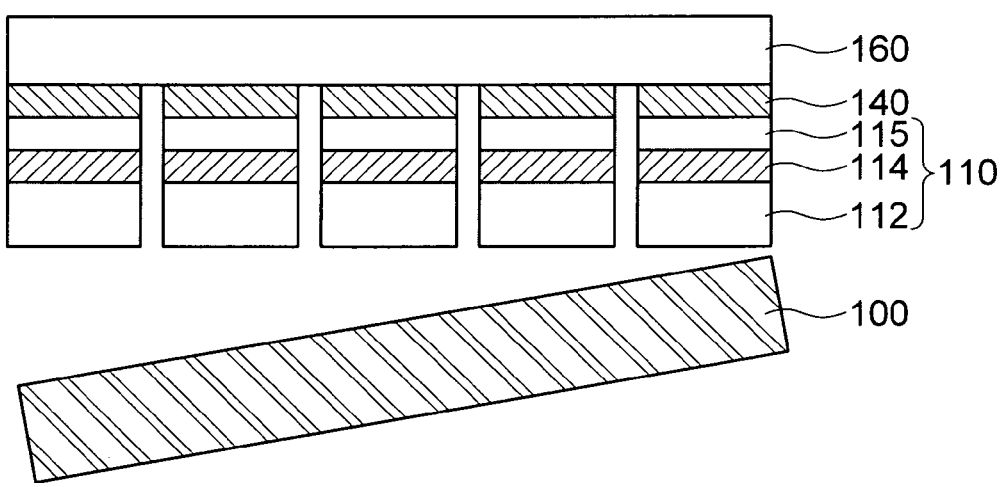
- Prior Art -

[FIG. 2]
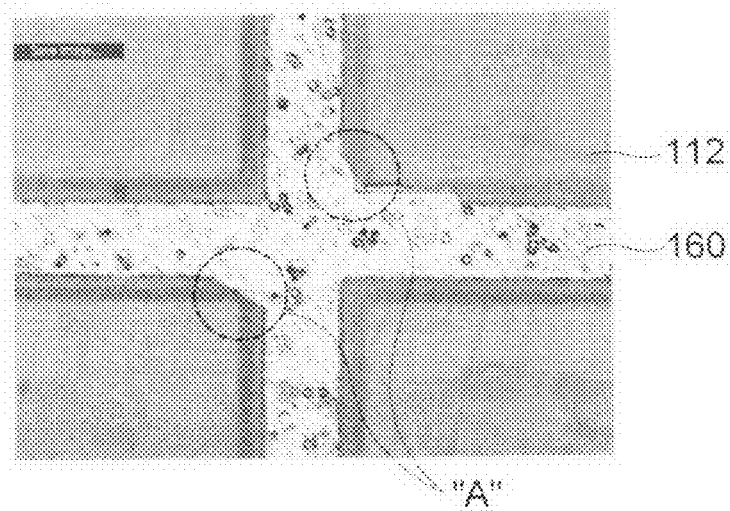
- Prior Art -
[FIG. 3A]
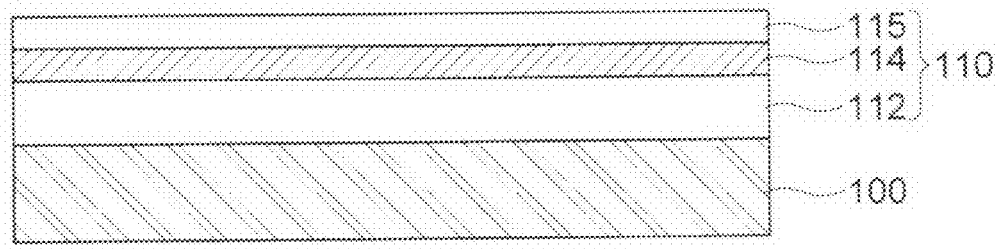
[FIG. 3B]
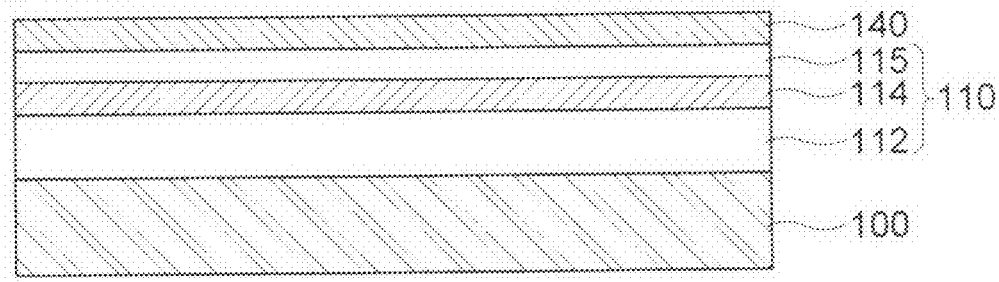
[FIG. 3C]
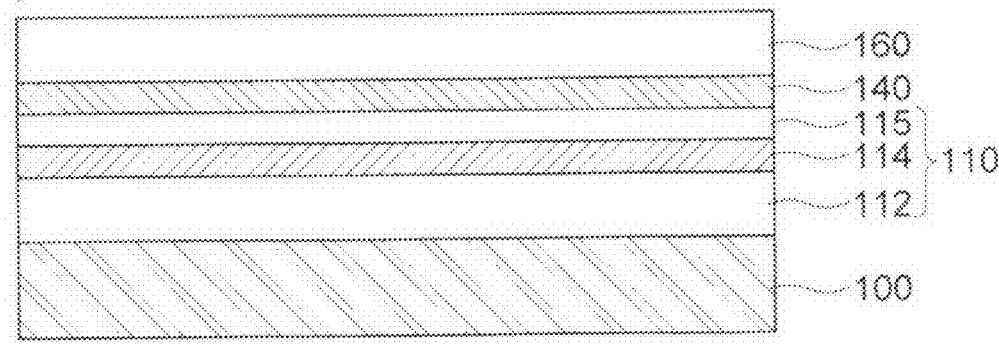

[FIG. 3D]
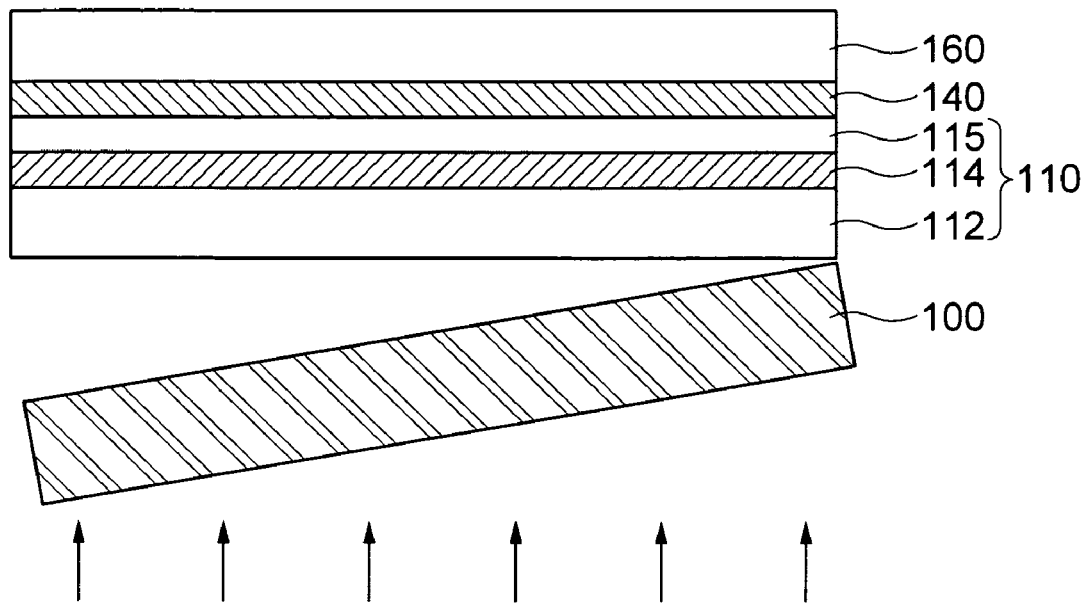
[FIG. 3E]
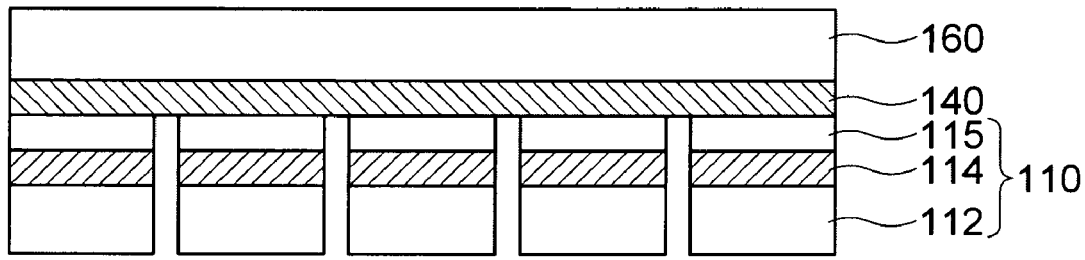
[FIG. 3F]
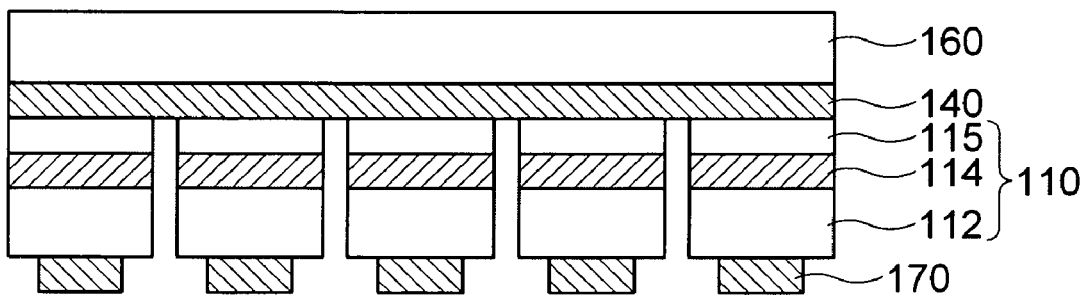

[FIG. 4]
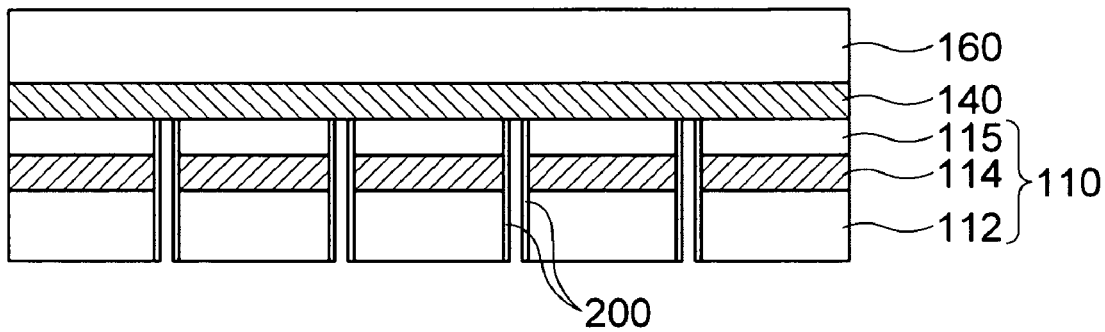
[FIG. 5]
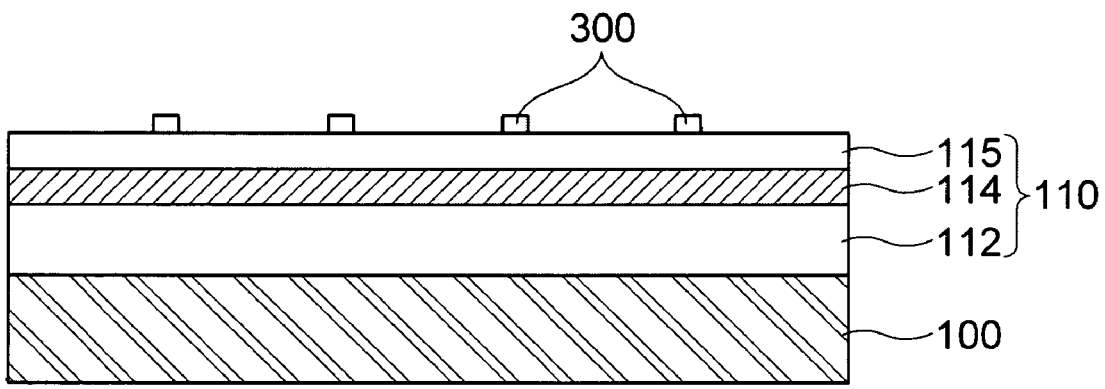
[FIG. 6A]
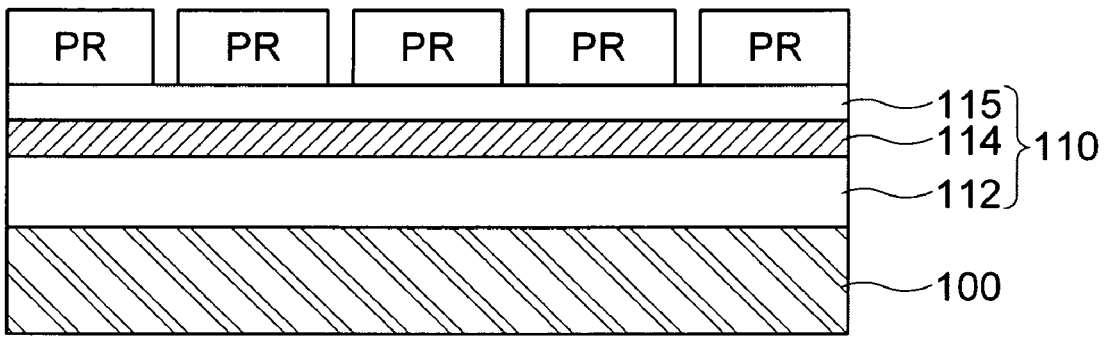
[FIG. 6B]
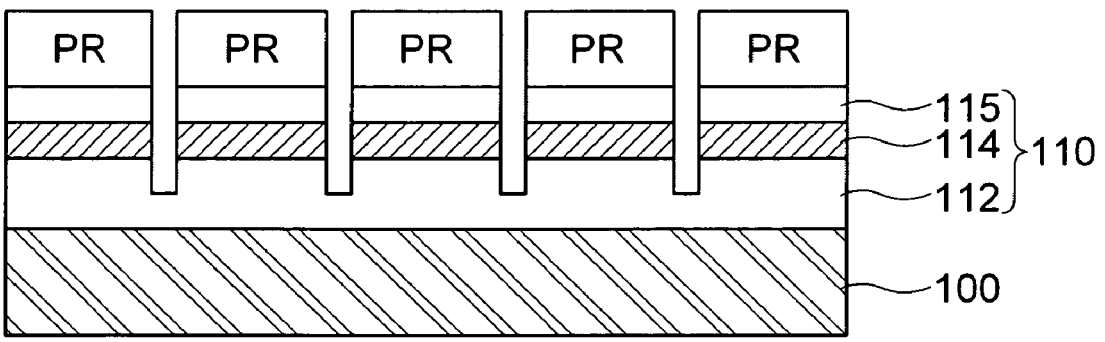

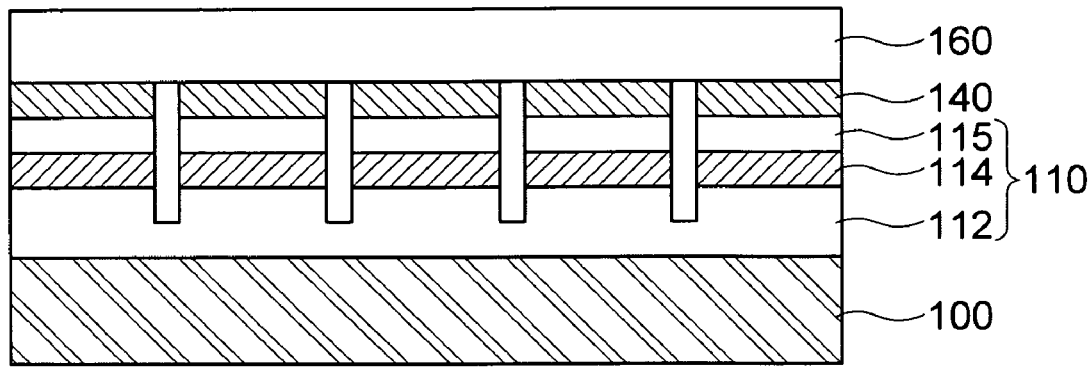
[FIG. 6C]
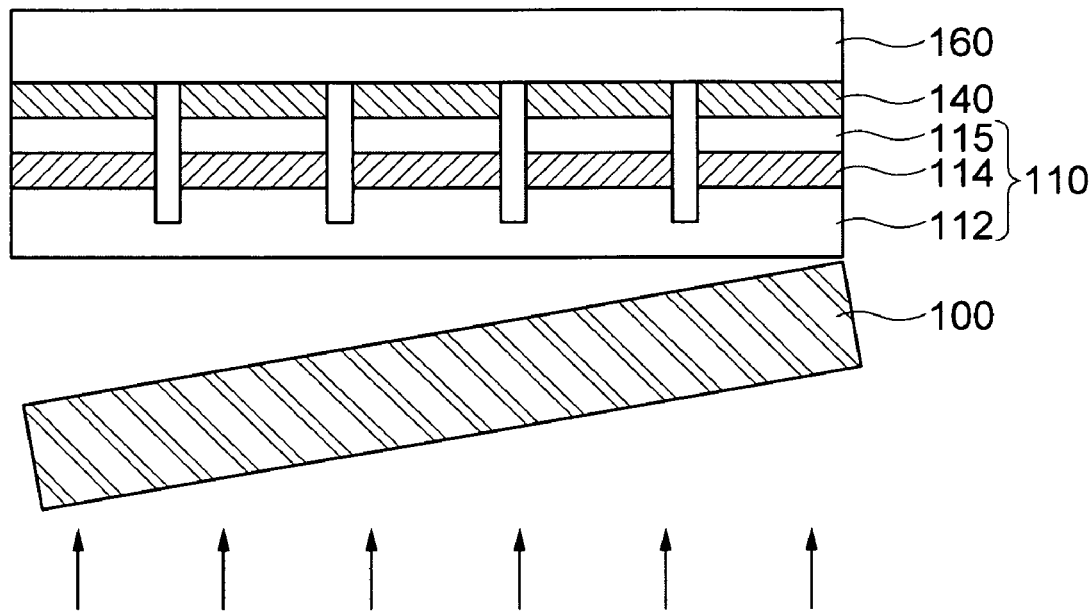
[FIG. 6D]
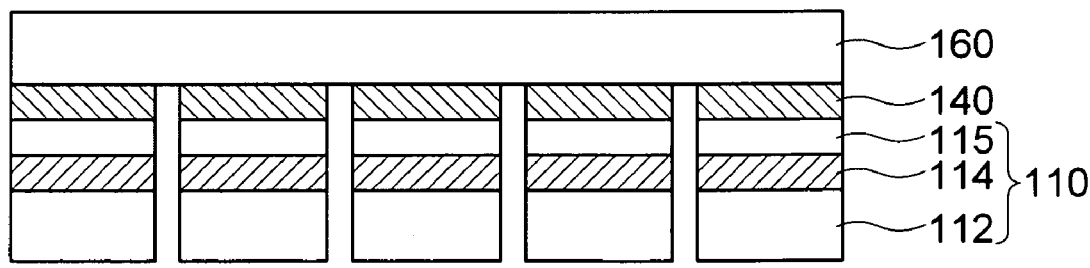
[FIG. 6E]

METHOD OF MANUFACTURING VERTICAL LIGHT EMITTING DIODE

CROSS-REFERENCE TO RELATED APPLICATIONS

This application claims the benefit of Korean Patent Application No. 10-2007-0120260 filed with the Korea Intellectual Property Office on Nov. 23, 2007, the disclosure of which is incorporated herein by reference.

BACKGROUND OF THE INVENTION

1. Field of the Invention

The present invention relates to a method of manufacturing a vertical light emitting diode (LED), which can prevent the damage of a light emitting structure during an LLO (laser lift-off) process for removing a sapphire substrate.

2. Description of the Related Art

Generally, a nitride-based semiconductor LED is grown on a sapphire substrate, but the sapphire substrate is a rigid nonconductor and has poor thermal conductivity. Therefore, there is a limitation in reducing the manufacturing costs by reducing the size of a nitride-based semiconductor LED, or improving the optical power and chip characteristic. Particularly, because the application of a high current is essential for achieving high power LED, it is important to solve a heat-sink problem of the LED. To solve this problem, there has been proposed a vertical LED in which a sapphire substrate is removed using an LLO technique.

Now, a conventional method of manufacturing a vertical LED will be described with reference to FIGS. 1A to 1F.

FIGS. 1A to 1F are process diagrams sequentially showing a conventional method of manufacturing a vertical LED.

First, as shown in FIG. 1A, a light emitting structure 110 is formed on a transparent substrate 110 such as sapphire. The light emitting structure 110 includes an n-type nitride semiconductor layer 112, a GaN/InGaN active layer 114 with a multi-quantum well structure, and a p-type nitride semiconductor layer 115, which are sequentially laminated.

As shown in FIG. 1B, photoresist patterns PR for defining a desired size of unit LED elements are formed on the p-type nitride semiconductor layer 115.

Subsequently, as shown in FIG. 1C, the light emitting structure 110 is isolated into unit LED elements through an ISO (isolation) process using dry etching such as ICP (inductive coupled plasma) or layer, with the photoresist patterns being set to an etching mask. Then, the photoresist patterns are removed.

Although not shown, after the light emitting structure 110 is isolated into unit LED elements, an insulating film or reflecting film may be formed on the side surfaces of the isolated light emitting structures 110. The insulating film or reflecting film can be omitted depending on the characteristics of LED and process conditions.

Next, as shown in FIG. 1D, a p-electrode 140 is formed on each of the isolated light emitting structures 110. Then, as shown in FIG. 1E, a structure support layer 160 is formed on the p-electrode 140.

Subsequently, as shown in FIG. 1F, the substrate 110 is removed through the LLO process. In the LLO process, when an energy of about 700 mJ/cm$^2$ is applied at the normal temperature in an arrow direction, the energy is absorbed at the interface between the substrate 100 and the light emitting structure 110 such that the bonded surface of the light emitting structure 110 is thermally discomposed, and the substrate 100 and the light emitting structure 110 are then separated from each other.

Then, although not shown, an n-electrode is formed on each of the n-type nitride semiconductor layers 112 which are exposed by the removing of the substrate, thereby forming vertical LEDs.

In the conventional method of manufacturing a vertical LED, when the LLO process for removing the substrate is performed, cracks occur at the edge of the light emitting structure 100, as indicated by 'A' in FIG. 2. Then, defects may occur in the LED. FIG. 2 is a photograph showing the problem of the vertical LED manufactured according to the conventional method.

Further, a crack may also occur in the insulating film or reflecting film formed on the side surfaces of the isolated light emitting structures or the adhesion therebetween may be degraded during the LLO process.

Therefore, when a vertical LED is manufactured according to the conventional method, the characteristic and reliability of the vertical LED are degraded because of the above-described problems.

SUMMARY OF THE INVENTION

An advantage of the present invention is that it provides a method of manufacturing a vertical LED, which can prevent the damage of a light emitting structure during an LLO process for removing a sapphire substrate.

Additional aspects and advantages of the present general inventive concept will be set forth in part in the description which follows and, in part, will be obvious from the description, or may be learned by practice of the general inventive concept.

According to an aspect of the invention, a method of manufacturing a vertical LED comprises the steps of: preparing a sapphire substrate; forming a light emitting structure in which an n-type nitride semiconductor layer, an active layer, and a p-type nitride semiconductor layer are sequentially laminated on the sapphire substrate; forming a p-electrode on the p-type nitride semiconductor layer; forming a structure support layer on the p-electrode; removing the sapphire substrate through an LLO (laser lift-off) process; isolating the light emitting structure into unit LED elements through an ISO (isolation) process; and forming an n-electrode on each of the n-type nitride semiconductor layers of the isolated light emitting structures.

Preferably, the method further comprises the step of forming an insulating film or reflecting film on the side surfaces of the isolated light emitting structures, after the isolating of the light emitting structure.

According to another aspect of the invention, a method of manufacturing a vertical LED comprises the steps of: preparing a sapphire substrate; forming a light emitting structure in which an n-type nitride semiconductor layer, an active layer, and a p-type nitride semiconductor layer are sequentially laminated on the sapphire substrate; forming buffer films on portions of the surface of the p-type nitride semiconductor layer corresponding to element isolation regions; forming a p-electrode on the resulting structure having the buffer films formed thereon; forming a structure support layer on the resulting structure having the p-electrode formed thereon; removing the sapphire substrate through an LLO process; isolating the light emitting structure into unit LED elements through an ISO process; and forming an n-electrode on each of the n-type nitride semiconductor layers of the isolated light emitting structures.

Preferably, the p-electrode is formed on the surface of the p-type nitride semiconductor layer excluding the portions on which the buffer films are formed.

Preferably, the buffer films are composed of a non-conductive material. As for the non-conducive material, photoresist, polyimide, epoxy, and dielectric may be used.

According to a further aspect of the invention, a method of manufacturing a vertical LED comprises the steps of: preparing a sapphire substrate; forming a light emitting structure in which an n-type nitride semiconductor layer, an active layer, and a p-type nitride semiconductor layer are sequentially laminated on the sapphire substrate; performing a first ISO process for isolating the light emitting structure into unit LED elements such that portions of the light emitting structure corresponding to element isolation regions remain with a predetermined thickness on the sapphire substrate; forming a p-electrode on the surface of the p-type nitride semiconductor layer corresponding to each unit LED element region; forming a structure support layer on the p-electrode; removing the sapphire substrate through an LLO process; performing a second ISO process for completely isolating the light emitting structure into unit LED elements by removing the remaining portions of the light emitting structure corresponding to the element isolation regions; and forming an n-electrode on each of the n-type nitride semiconductor layers of the isolated light emitting structures.

Preferably, the method further comprises the step of forming a first insulating film or first reflecting film on the side surfaces of the isolated light emitting structures after the performing of the first ISO process.

Preferably, the method further comprises the step of forming a second insulating film or second reflecting film on the side surfaces of the isolated light emitting structures after the performing of the second ISO process.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1F are process diagrams sequentially showing a conventional method of manufacturing a vertical LED;

FIG. 2 is a photograph showing the problem of a vertical LED manufactured according to the conventional method;

FIGS. 3A to 3F are process diagrams sequentially showing a method of manufacturing a vertical LED according to a first embodiment of the invention;

FIG. 4 is a process diagram for explaining a modification of the method of manufacturing a vertical LED according to the first embodiment of the invention;

FIG. 5 is a process diagram for explaining a method of manufacturing a vertical LED according to a second embodiment of the invention; and FIGS. 6A to 6E are process diagrams sequentially showing a method of manufacturing a vertical LED according to a third embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a method of manufacturing a vertical LED according to the present invention will be described in detail with reference to the accompanying drawings.

First Embodiment

Referring to FIGS. 3A to 3F, a method of manufacturing a vertical LED according to a first embodiment of the invention will be described.

FIGS. 3A to 3F are process diagrams sequentially showing a method of manufacturing a vertical LED according to a first embodiment of the invention.

First, as shown in FIG. 3A, a light emitting structure 110 composed of a nitride-based semiconductor layer is formed on a transparent substrate 100 such as sapphire. The light emitting structure 110 includes an n-type nitride semiconductor layer 112, a GaN/InGaN active layer 114 with a multi-quantum well structure, and a p-type nitride semiconductor layer 115, which are sequentially laminated.

The n-type and p-type nitride semiconductor layer 112 and 115 and the active layer 114 may be formed of a nitride semiconductor material having a compositional formula of $Al_x In_y Ga_{(1-x-y)} N$ (here, $0 \leq x \leq 1, 0 \leq y \leq 1,$ and $0 \leq x+y \leq 1$) and can be formed through a well-known nitride deposition process such as MOCVD (Metal Organic Chemical Vapor Deposition).

The active layer 114 may be formed of one quantum-well layer or with a double-hetero structure.

Subsequently, as shown in FIG. 3B, a p-electrode 140 is formed on the p-type nitride semiconductor 115 of the light emitting structure 110. Preferably, the p-electrode 140 is formed so as to serve as an electrode and a reflecting film.

Then, as shown in FIG. 3C, a bonding layer (not shown) for bonding a structure support layer through an eutectic bonding method is formed on the p-electrode 140, and high temperature and pressure is applied to the bonding layer so as to perform a bonding process for bonding the structure support layer 160 on the p-electrode 140. Since the structure support layer 160 is to serve as a support layer and electrode of a finalized LED, the structure support layer 160 is formed of a silicon substrate having excellent heat conductivity and conductance.

The bonding layer may be formed of gold (Au) or an alloy containing Au (for example, AuSn).

Next, as shown in FIG. 3D, the substrate 100 is removed through an LLO process. In the LLO process, when an energy of about 700 mJ/cm$^2$ is applied at the normal temperature in an arrow direction, the energy is absorbed at the interface between the substrate 100 and the light emitting structure 110 such that the bonded surface of the light emitting structure 110 is thermally discomposed, and the substrate 100 and the light emitting structure 110 are then separated from each other.

Then, a photoresist pattern (not shown) for defining a desired size of unit LED elements is formed on the n-type nitride semiconductor 112.

Continuously, as shown in FIG. 3E, the light emitting structure 110 is isolated into unit LED elements by a drying etching process using ICP (Inductive Coupled Plasma) or an isolation (ISO) process using laser, with the photoresist pattern being set to an etching mask, and the photoresist pattern is then removed.

Next, as shown in FIG. 3F, an n-electrode 170 is formed on each of the n-type nitride semiconductor layers 112 of the isolated light emitting structures 110, thereby forming the vertical LED.

In this embodiment, the ISO process for isolating the light emitting structure into unit LED elements is performed after the LLO process for separating the sapphire substrate. Therefore, it is possible to prevent the damage of the light emitting structure such as cracks which have occurred due to an impact of laser during the LLO process in the related art.

Meanwhile, as shown in FIG. 4, after the light emitting structure 110 is isolated into unit LED elements, that is, the process of FIG. 3E is performed, an insulating film 200 may be formed on the side surfaces of the isolated light emitting structures 110. The insulating film 200 may be omitted depending on the characteristic of LED and a process condition. In this case, a reflecting film may be formed instead of the insulating film 200, depending on the characteristic of LED. FIG. 4 is a process diagram for explaining the modification of the method of manufacturing a vertical LED according to the first embodiment of the invention.

Second Embodiment

Referring to FIG. 5, a method of manufacturing a vertical LED according to a second embodiment of the invention will be described. The descriptions of the same construction as that of the first embodiment will be omitted.

FIG. 5 is a process diagram for explaining a method of manufacturing a vertical LED according to a second embodiment of the invention.

The method of manufacturing a vertical LED according to the second embodiment is performed in almost the same manner as the first embodiment. As shown in FIG. 5, however, the method of manufacturing a vertical LED according to the second embodiment further includes the step of forming buffer films 300 on portions of the surface of the p-type nitride semiconductor layer 115 corresponding to element isolation regions, before the p-electrode 140 is formed on the p-type nitride semiconductor layer 115.

In this embodiment, the ISO process for isolating the light emitting structure into unit LED elements is performed after the LLO process for separating the substrate, like the first embodiment. Therefore, it is possible to obtain the same effect as that of the first embodiment.

Preferably, the buffer film 300 is formed of a non-conductive material. More specifically, the buffer film 300 may be formed of photoresist, polyimide, epoxy, or dielectric.

Since the method according to the second embodiment further includes the process of forming the buffer films 300, the p-electrode can be more reliably protected from an impact of laser during the ISO process than in the first embodiment.

Third Embodiment

Referring to FIGS. 6A to 6E, a method of manufacturing a vertical LED according to a third embodiment of the invention will be described. The descriptions of the same construction as that of the first embodiment will be omitted.

FIGS. 6A to 6E are process diagrams sequentially showing a method of manufacturing a vertical LED according to a third embodiment of the invention.

The method of manufacturing a vertical LED according to the third embodiment is performed in almost the same manner as the first embodiment. However, the method according to the third embodiment is different from the first embodiment in that the process of isolating the light emitting structure 110 into unit LED elements is divided into two steps, and the LLO process for removing the substrate 110 from the light emitting structure 110 is performed between two steps.

More specifically, the method of manufacturing a vertical LED according to the third embodiment of the invention is performed as follows. First, the light emitting structure 110 is formed on the substrate 100, as shown in FIG. 3A of the first embodiment.

Then, as shown in FIG. 6A, photoresist patterns PR for defining a desired size of unit LED elements are formed on the p-type nitride semiconductor layer 115 of the light emitting structure 110.

Subsequently, as shown in FIG. 6B, a first ISO process for isolating the light emitting structure 110 into unit LED elements is performed using laser or a drying etching process using ICP, with the photoresist patterns being set to an etching mask, such that portions of the light emitting structure 110 corresponding to element isolation regions remain with a predetermined thickness.

Next, the photoresist patterns PR are removed.

Then, as shown in FIG. 6C, the p-electrode 140 is formed on the surface of the p-type nitride semiconductor layer 115 of each unit LED element, and the structure support layer 160 is formed on the p-electrode 140.

Next, as shown in FIG. 6D, the substrate 100 is removed through the LLO process.

Subsequently, as shown in FIG. 6E, the remaining portions of the light emitting structure 110 corresponding to element isolation regions are removed through a second ISO process such that the light emitting structure 110 is isolated into unit LED elements.

Then, as shown in FIG. 3F of the first embodiment, an n-electrode 170 is formed on each of the n-type nitride semiconductor layers 112 of the isolated light emitting structures 110.

In this embodiment, the second ISO process in which the light emitting structure is completely isolated into the unit LED elements is performed after the LLO process for removing the substrate, as in the first embodiment. Therefore, it is possible to obtain the same effect as the first embodiment.

Although not shown, the method according to the third embodiment of the invention may further include the steps of: forming a first insulating film or a first reflecting film on the side surfaces of the isolated light emitting structures after the first ISO process and forming a second insulating film or a second reflecting film on the side surfaces of the isolated light emitting structures after the second ISO process, depending on characteristics of LED and a process condition.

According to the present invention, the LLO process for separating the sapphire substrate from the light emitting substrate is performed before the ISO process for isolating the light emitting structure into unit LED elements. Therefore, it is possible to prevent the damage of the light emitting structure such as cracks caused by an impact of laser during the LLO process.

Accordingly, the method according to the invention can enhance not only the characteristic and reliability of the vertical LED but also the production yield of the vertical LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical LED, comprising the steps of: preparing a sapphire substrate; forming a light emitting structure in which an n-type nitride semiconductor layer, an active layer, and a p-type nitride semiconductor layer are sequentially laminated on the sapphire substrate; forming buffer films on portions of the surface of the p-type nitride semiconductor layer; forming a p-electrode on the resulting structure having the buffer films formed thereon; forming a structure support layer on the resulting structure having the p-electrode formed thereon; removing the sapphire substrate through an LLO (Laser Lift-Off) process; isolating the light emitting structure into unit LED elements by removing portions of the light emitting structure corresponding to position of the buffer films through an ISO (Isolation) process; and forming an n-electrode on each of the n-type nitride semiconductor layers of the isolated light emitting structures.

2. The method according to claim 1, wherein the p-electrode is formed on the surface of the p-type nitride semiconductor layer excluding the portions on which the buffer films are formed.

3. The method according to claim 1, wherein the buffer films are composed of a non-conductive material.

4. The method according to claim 3, wherein the non-conductive material is one or more selected form the group consisting of photoresist, polyimide, epoxy, and dielectric.

5. The method according to claim 1 further comprising the step of:
   forming an insulating film on the side surfaces of the isolated light emitting structures after the isolating of the light emitting structure.

6. The method according to claim 1 further comprising the step of:
   forming a reflecting film on the side surfaces of the isolated light emitting structures after the isolating of the light emitting structure.

* * * * *